United States Patent [19]

Anderson

[11] 4,407,416

[45] Oct. 4, 1983

[54] MOUNTING FRAME SYSTEM FOR CIRCUIT BOARDS

[75] Inventor: Dale L. Anderson, Mound, Minn.

[73] Assignee: Protronix, Inc., Minneapolis, Minn.

[21] Appl. No.: 169,294

[22] Filed: Jul. 16, 1980

[51] Int. Cl.³ .......................... A47F 5/00; A47F 7/00
[52] U.S. Cl. ................................... 211/41; 211/189; 211/183; 361/415; 403/231
[58] Field of Search ............... 211/41, 182, 189, 183, 211/192; 403/231, 262, 199, 205, 263, 230; 52/475, 664, 665; 248/670; 361/415, 429

[56] References Cited

U.S. PATENT DOCUMENTS

| | | |
|---|---|---|
| 2,940,016 | 6/1960 | Flint et al. |
| 3,001,106 | 9/1961 | Higgs |
| 3,098,177 | 7/1963 | Bleier et al. |
| 3,139,559 | 6/1964 | Heidler |
| 3,184,650 | 5/1965 | Ecker |
| 3,197,731 | 7/1965 | Beale et al. |
| 3,209,208 | 9/1965 | Francis et al. |
| 3,265,935 | 8/1966 | Rosa |
| 3,271,626 | 9/1966 | Howrilka |
| 3,288,301 | 11/1966 | Kent et al. |
| 3,316,460 | 4/1967 | Scoville |
| 3,333,387 | 8/1967 | Deakins ............................ 52/664 |
| 3,349,288 | 10/1967 | Lohs et al. |
| 3,360,689 | 12/1967 | Haury |
| 3,372,308 | 3/1968 | Noschese et al. |
| 3,375,029 | 3/1968 | Frye et al. ........................ 403/230 |
| 3,386,012 | 5/1968 | Seelig |
| 3,458,767 | 7/1969 | Hedger et al. |
| 3,511,385 | 5/1970 | Ayling |
| 3,523,218 | 8/1970 | Fradley et al. |
| 3,594,689 | 7/1971 | Hopt et al. |
| 3,603,845 | 9/1971 | Beers |
| 3,640,399 | 2/1972 | Hartman |
| 3,696,936 | 10/1972 | Straccia et al. |
| 3,699,396 | 10/1972 | Colaud et al. |
| 3,775,643 | 11/1973 | Schachnow et al. |
| 3,812,402 | 5/1974 | Garth |
| 3,838,777 | 10/1974 | Thornicroft et al. |
| 3,904,937 | 9/1975 | Levin |
| 4,013,928 | 3/1977 | Sarinopoulos et al. |
| 4,075,683 | 2/1978 | Johansson et al. |
| 4,115,839 | 9/1978 | Hummel |

Primary Examiner—Ramon S. Britts
Assistant Examiner—Robert W. Gibson, Jr.
Attorney, Agent, or Firm—Merchant, Gould, Smith, Edell, Welter & Schmidt

[57] ABSTRACT

The disclosure is directed to a modular frame assembly for electrical and electronic components and a universal rail member used in its formation which permits fabrication of the assembly in various sizes and configurations. The rail member comprises an elongated web with longitudinal sides and edges. A pair of first ridge members project laterally outward from one side of the web and extend over its length in spaced, parallel relation. A pair of second ridge members project laterally outward from the opposite side of the web, also extending over its length in parallel, spaced relation. The second ridge members are spaced apart to engageably receive the first ridge members of another rail member in interlockable relation. At least one notch is formed in each of the second ridge members, the notches being transversely aligned, and sized and configured to receive the end of another rail member in perpendicular, interlocking relation.

20 Claims, 30 Drawing Figures

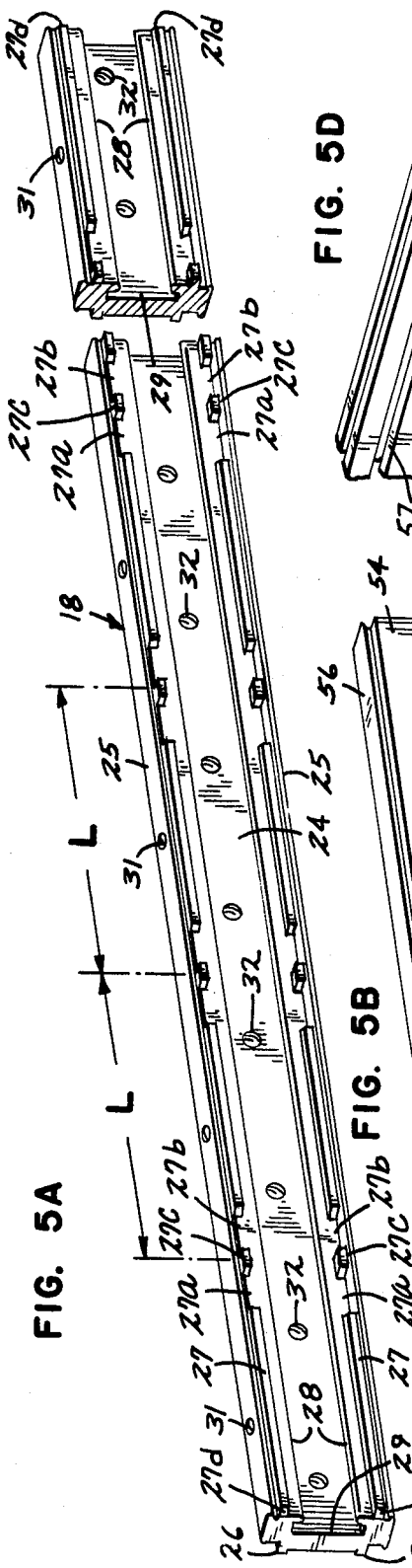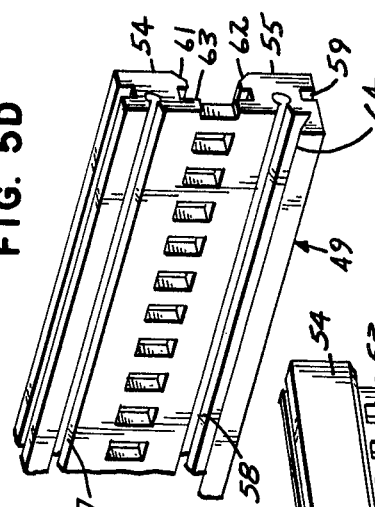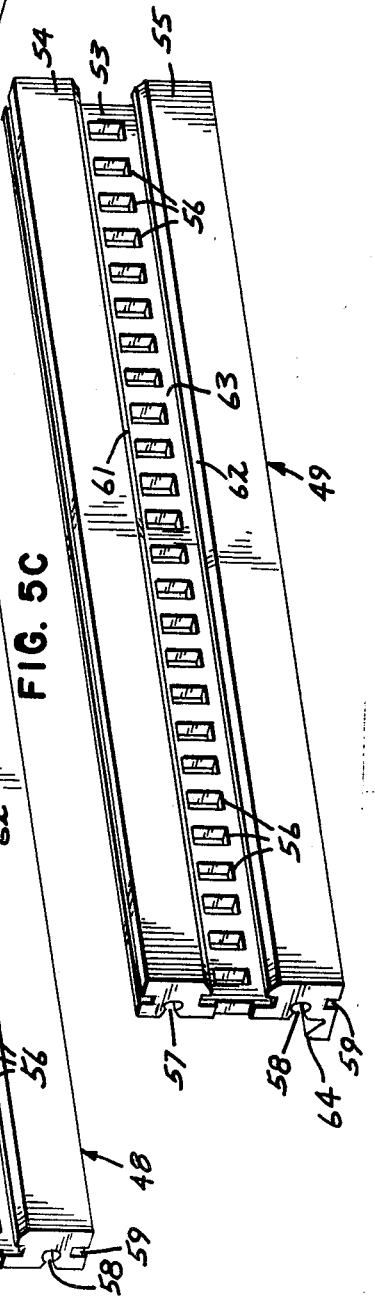

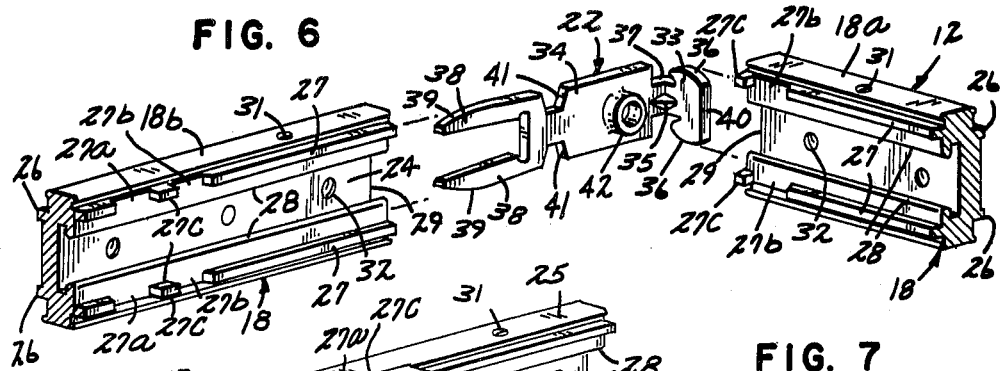
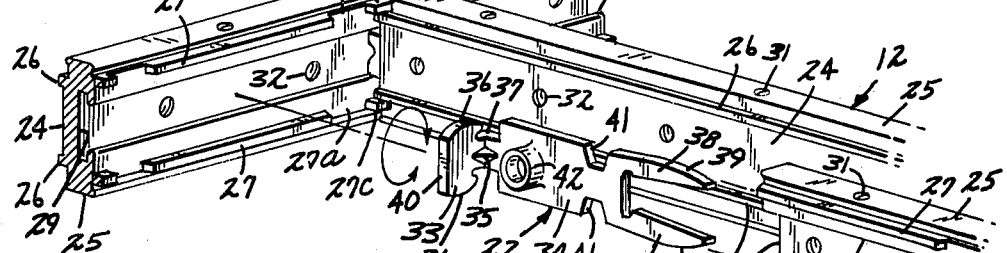
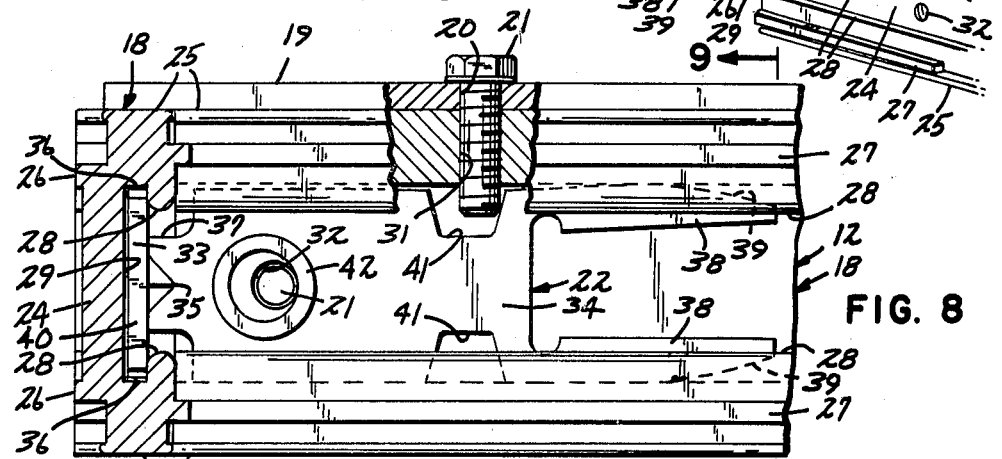
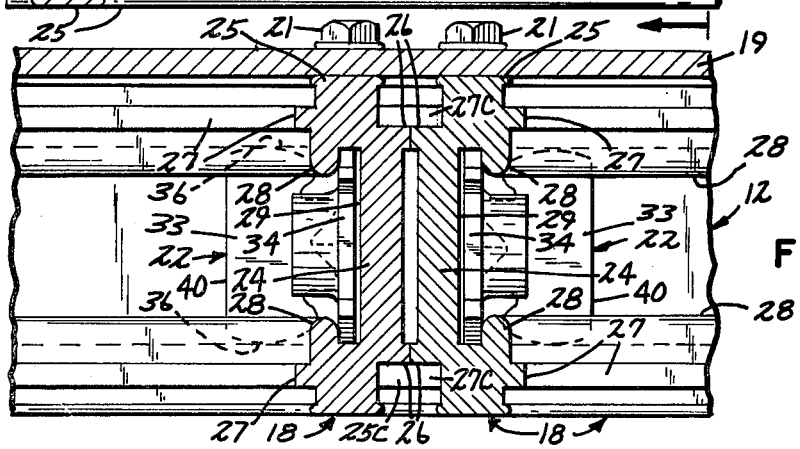

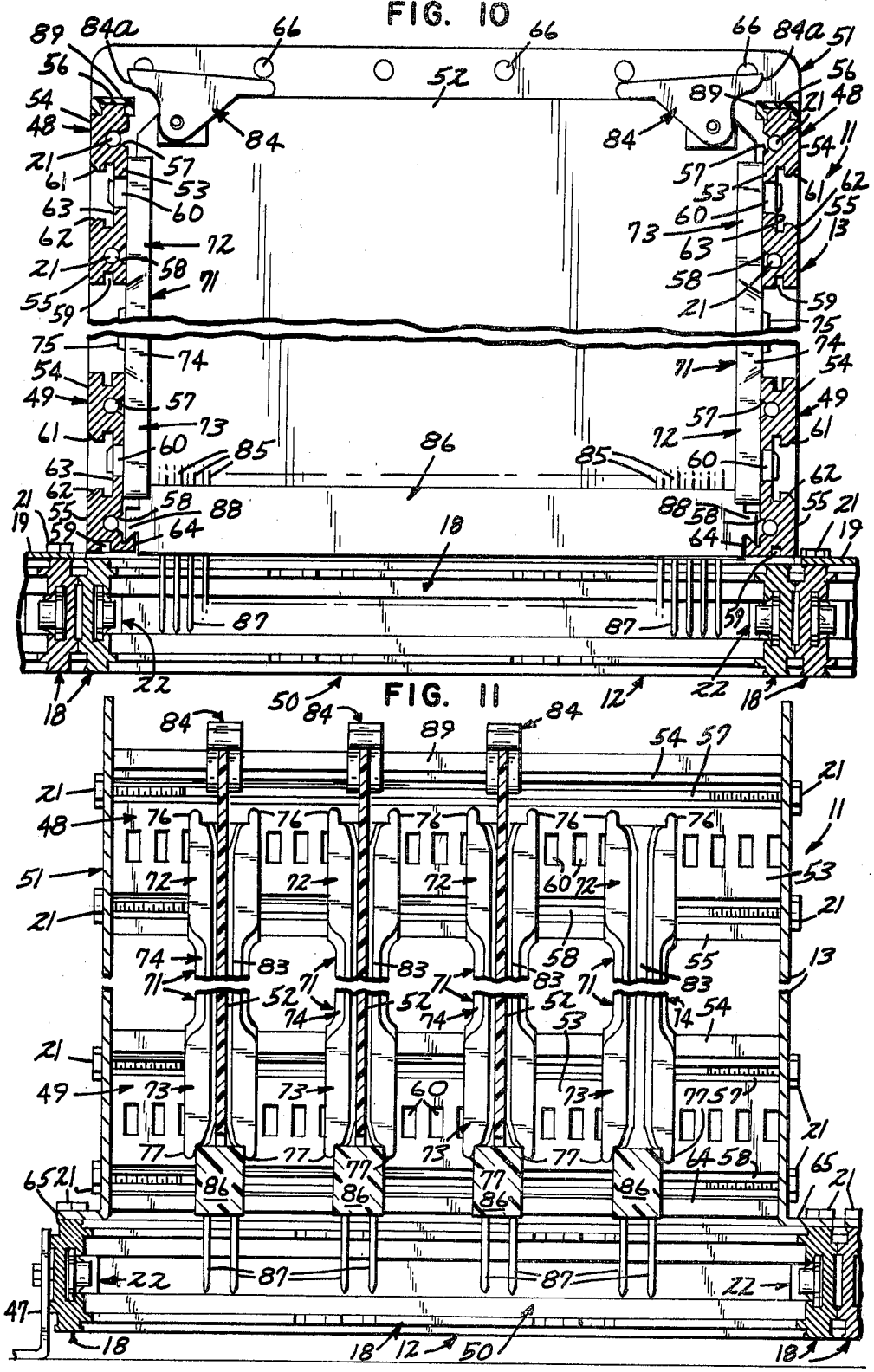

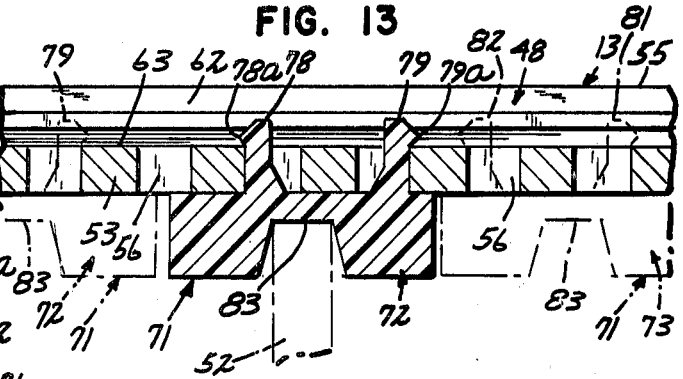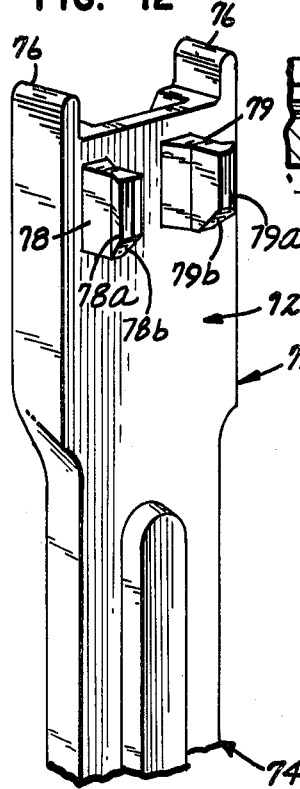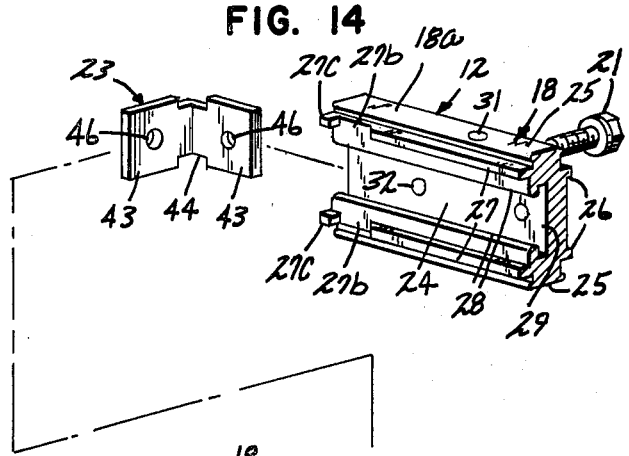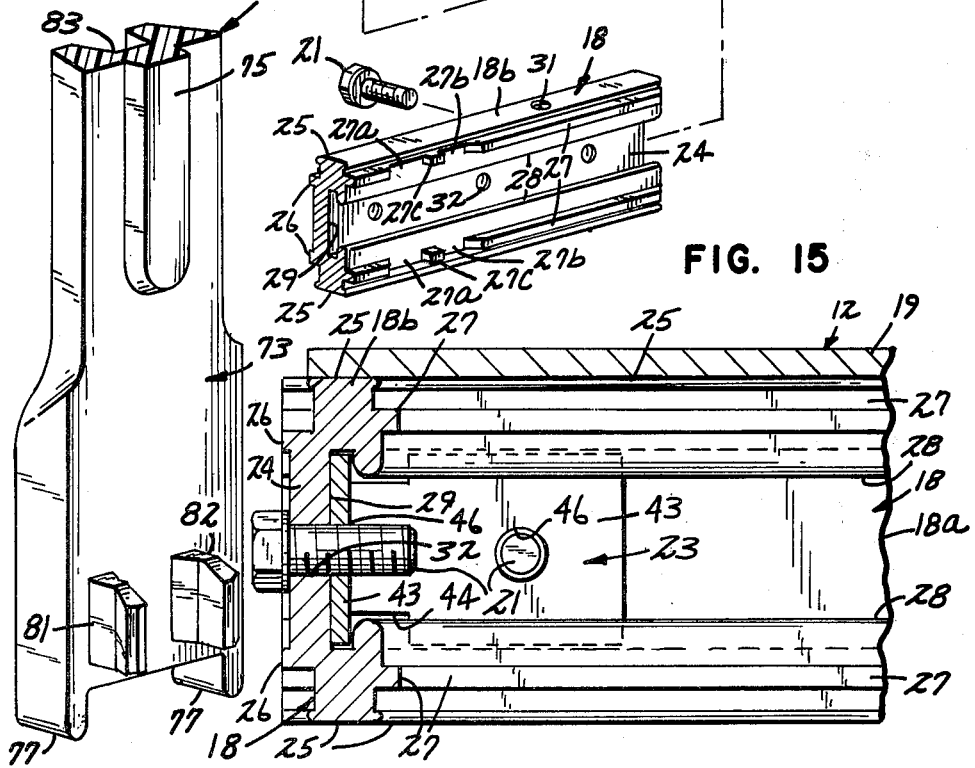

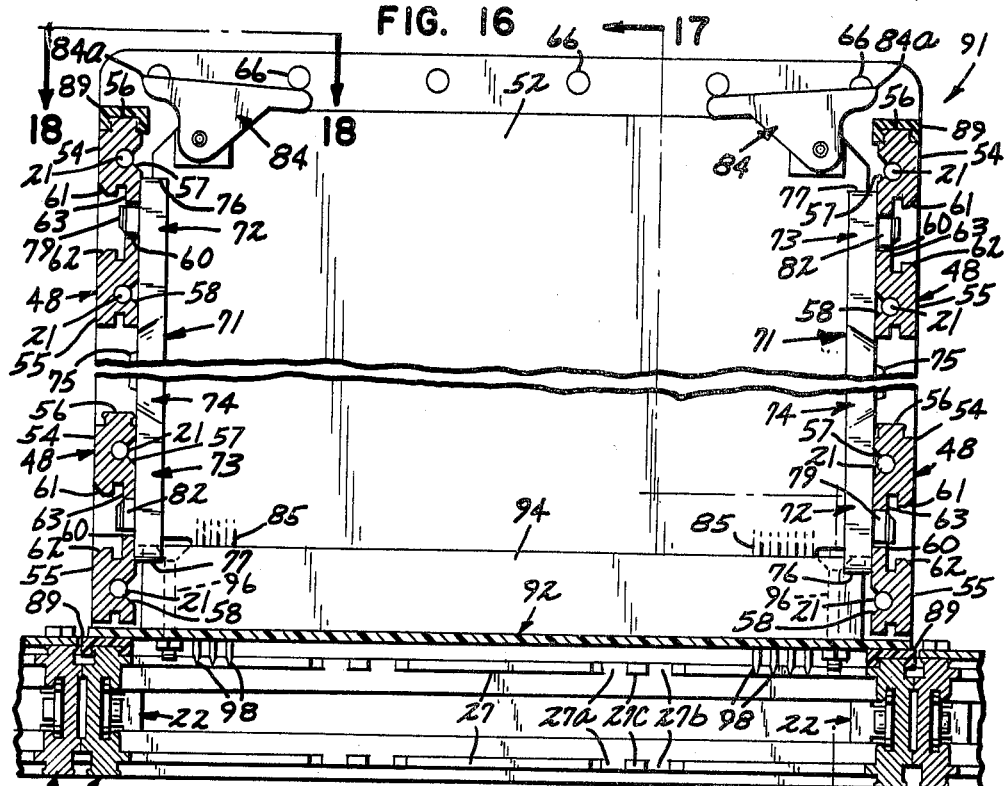
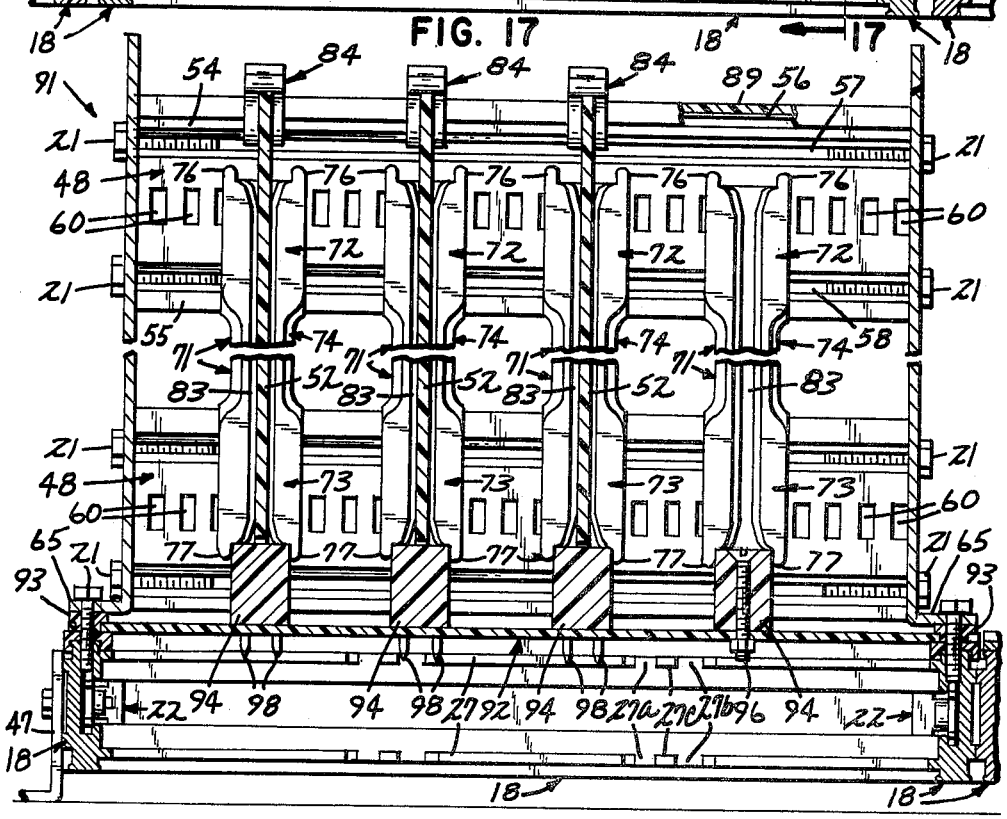

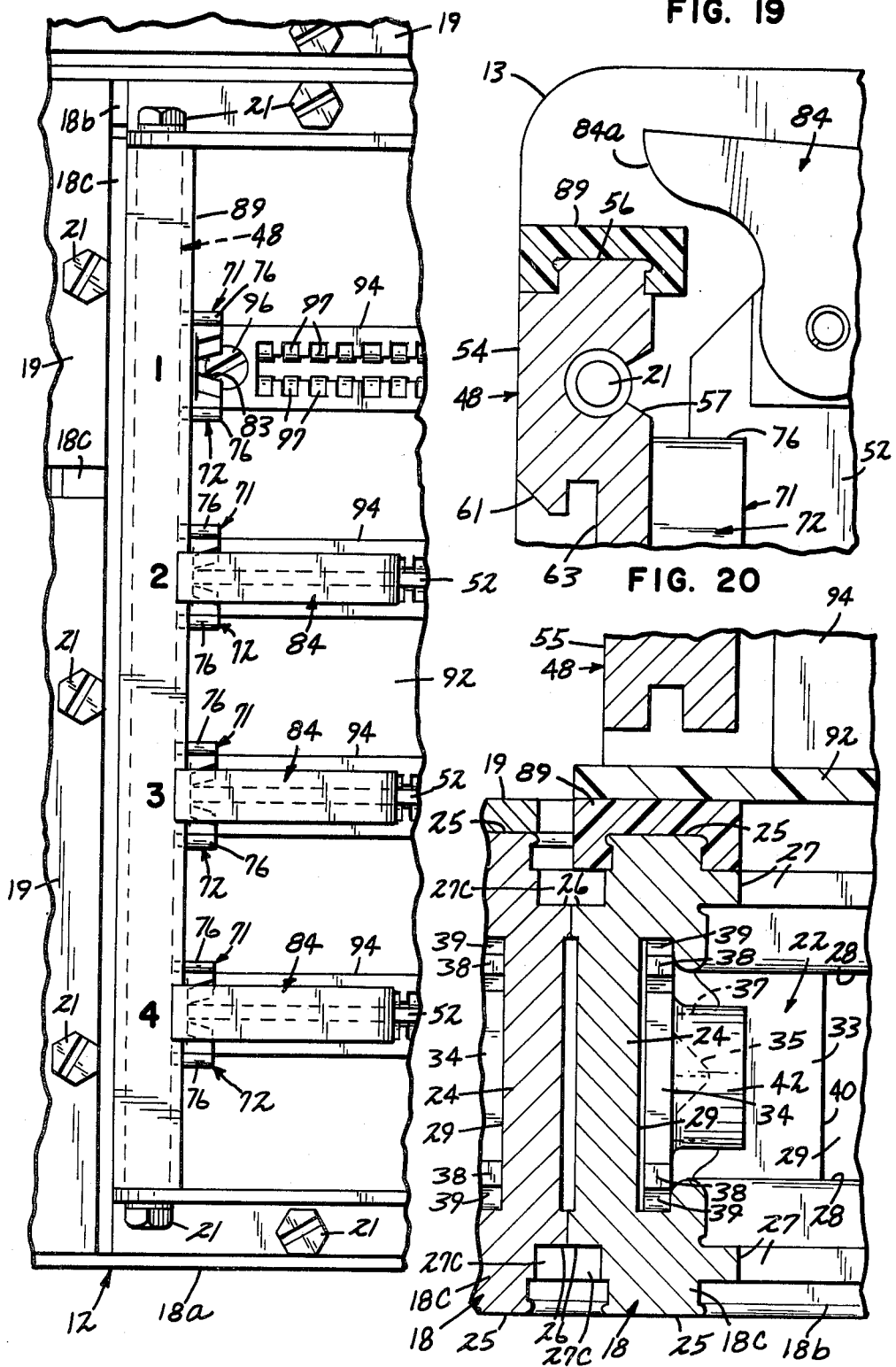

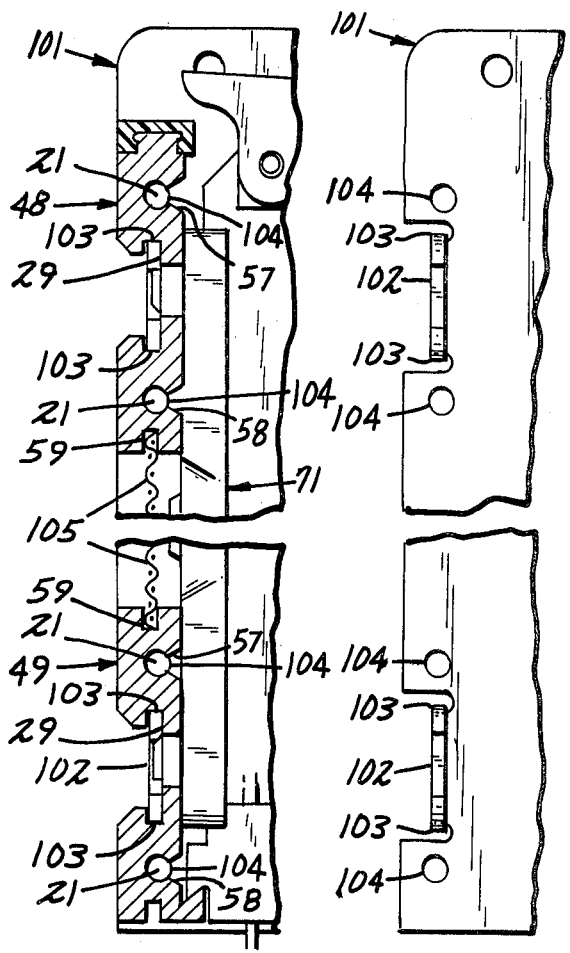
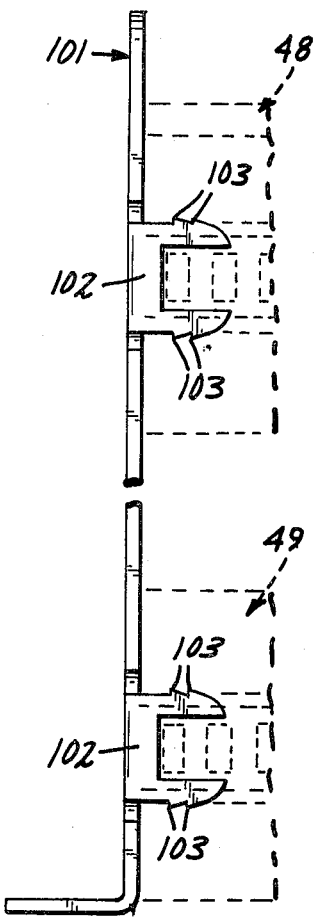
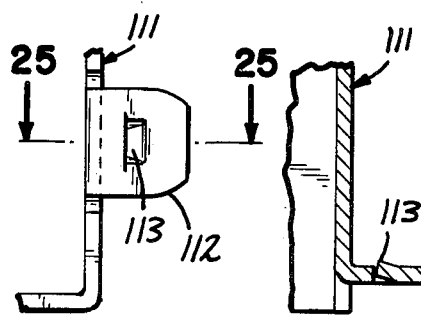
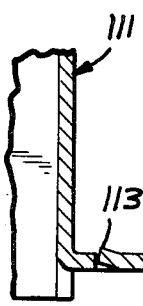
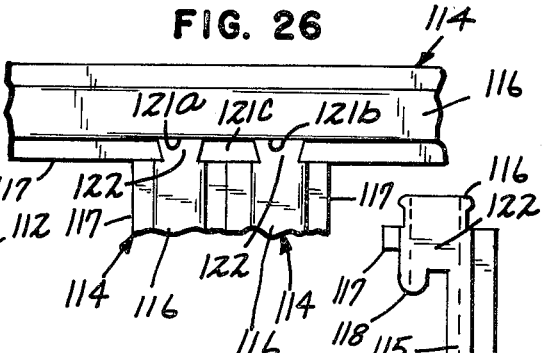
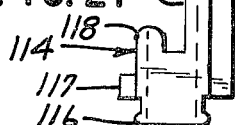

4,407,416

MOUNTING FRAME SYSTEM FOR CIRCUIT BOARDS

TECHNICAL FIELD

The invention broadly relates to frame housings for electronic components, and is specifically directed to a modular frame system for printed circuit cards and related electrical components.

BACKGROUND OF THE INVENTION

Frames and racks are commonly used for all types of electrical components to serve as a common support and electrical ground. Generally, such frames tend to be designed for a single application and incapable of variation in dimension or function.

In the past, most electrical and electronic components were quite large, and this factor determined the size and configuration of the mounting frame. As electronic components have decreased significantly in size, there has been some degree of development in connection with mounting frames, but it has not been nearly as significant as in the components themselves.

Because of the decreased size of electronic components, printed circuit boards or cards are now commonly and widely used. These cards house sophisticated and complex electronic circuitry, and typical electronic systems involve the use of several cards that are supported in a single rack or cage and commonly connected into the electronic system.

Because each electronic system and its associated circuitry may be quite unique, frame systems generally are specifically designed to the physical requirements of the systems. Although the electronic and electrical components themselves have become modular in form, as evidenced by the use of printed circuit boards and cards, there has not been any substantial effort to offer a purely modular frame mounting system which can be assembled in various sizes and configurations from off the shelf components to house and support printed circuit cards as well as the heavier and larger attendant components, such as the power supplies, blowers, speed controls and the like.

SUMMARY OF THE INVENTION

The subject invention is directed to such a modular system in which the entire assembly may be designed and fabricated from universal components of different sizes to vary the size and configuration of the frame assembly, and which interfit without regard to the selected size.

The modular system broadly comprises a base frame assembly for larger and heavier components, and a printed circuit card cage mounted on the base frame assembly. The base frame assembly is formed from a plurality of lengths of a mounting rail that is configured to be interlockable when two lengths are brought together in perpendicular relation. The base frame assembly also consists of one or more mounting plates that cooperate with the mounting rail frame to support the larger and heavier electrical components in a desired position. In the preferred embodiment, the mounting plates cover all of the frame except for a rectangular opening for the printed circuit card cage. A printed circuit board may be used with or in place of the mounting plates.

The card cage is formed from a plurality of lengths of a mounting rail of a second configuration. These lengths are preferably disposed in parallel spaced pairs, and side plates are secured at each of the respective ends to define a hollow housing or frame in the form of a rectangular parallelepiped. The second type of mounting rail is formed with a row of uniformly spaced apertures to interlockably receive the connecting tabs of elongated printed circuit card guides. The guides are disposed in laterally aligned pairs to slidably receive and retain a printed circuit card.

The apertures in the mounting rails permit the card guides to be laterally adjusted to a desired position. In addition, the connecting tabs on the card guides are offset in such a manner that the guide may be reversed end for end to obtain an incremental adjustment in the printed circuit card position.

An electrical socket connector is disposed between each pair of card guides to receive one edge of the card for electrical contact purposes. In one embodiment, the socket connector is supported by the mounting rail and is locked into position by the card guides when they are inserted. In a second embodiment, the socket connectors are semipermanently secured to a horizontally disposed mother board which is secured between the base frame assembly and the card cage. With the mother board and card cage in assembled position, the card guides are inserted relative to the socket connectors, and the printed circuit cards are thereafter inserted into place.

The inventive structure permits the user to simply and easily design a modular frame system based on the needs of the electronic circuits and components, using available components of varying size. Once designed, the modular frame assembly is easily fabricated, while at the same time offering rugged, stable support to the electronic system components. Further, even though the modular system accommodates a large variety of sizes and configurations, no adjustment is necessary during fabrication or after assembly. Because the frame system components are fabricated with uniform spacing, the components automatically fit together, and electronic system components are thereafter accepted without problem.

BRIEF DESCRIPTION OF THE DRAWINGS

FIG. 5a is an enlarged perspective view of a first longitudinal mounting rail for the mounting system;

FIG. 5b is an enlarged perspective view of a second longitudinal mounting rail for the modular system;

FIG. 5c is an enlarged perspective view of a third longitudinal mounting rail for the modular system similar to that of FIG. 5b;

FIG. 5d is an enlarged perspective view of the mounting rail of FIG. 5c showing the opposite side thereof;

FIG. 6 is an exploded perspective of two of the mounting rails of FIG. 5a interconnected by an internal fastener;

FIG. 7 is a perspective view of a different assembly of the mounting rails of FIG. 5a and a different application of the internal fastener;

FIG. 8 is an enlarged fragmentary sectional view taken along the line 8—8 of FIG. 3;

FIG. 9 is a fragmentary sectional view taken along the line 9—9 of FIG. 8;

FIG. 10 is an enlarged fragmentary sectional view taken along the line 10—10 of FIG. 3;

FIG. 11 is an enlarged fragmentary sectional view taken along the line 11—11 of FIG. 3;

FIG. 12 is an enlarged fragmentary perspective view of a longitudinal guide for a pivot circuit board or card;

FIG. 13 is an enlarged fragmentary sectional view taken along the line 13—13 of FIG. 11;

FIG. 14 is an exploded perspective view of two of the mounting rails of FIG. 5a and a second internal fastener of the corner type;

FIG. 15 is an enlarged view in section of the mounting rails and corner internal fastener of FIG. 14 in assembled relation;

FIG. 16 is a view similar to FIG. 10 of a modified modular mounting frame system;

FIG. 17 is an enlarged fragmentary sectional view taken along the line 17—17 of FIG. 16;

FIG. 18 is an enlarged fragmentary sectional view taken along the line 18—18 of FIG. 16;

FIG. 19 is a fragmentary enlargement of a first portion of FIG. 16, showing in particular a plastic identification cap for the top edge of one of the mounting rails for identifying a particular printed circuit card or cards;

FIG. 20 is a fragmentary enlargement of a second portion of FIG. 16 showing the different application of the plastic cap;

FIG. 21 is a fragmentary view similar to FIGS. 10 and 16 showing an alternative embodiment of the card cage;

FIG. 22 is a fragmentary view in side elevation of an alternative side plate for the card cage shown in FIG. 21;

FIG. 23 is a view in end elevation of the alternative side plate of FIG. 22;

FIG. 24 is a fragmentary view similar to FIG. 23 showing a second alternative embodiment of the side plate;

FIG. 25 is a fragmentary sectional view taken along the line 25—25 of FIG. 24;

FIG. 26 is an enlarged fragmentary sectional view of an alternative mounting rail in interlocking construction; and FIG. 27 is an enlarged end view of the alternative mounting rail of FIG. 26.

DESCRIPTION OF THE PREFERRED EMBODIMENTS

Figure 1:
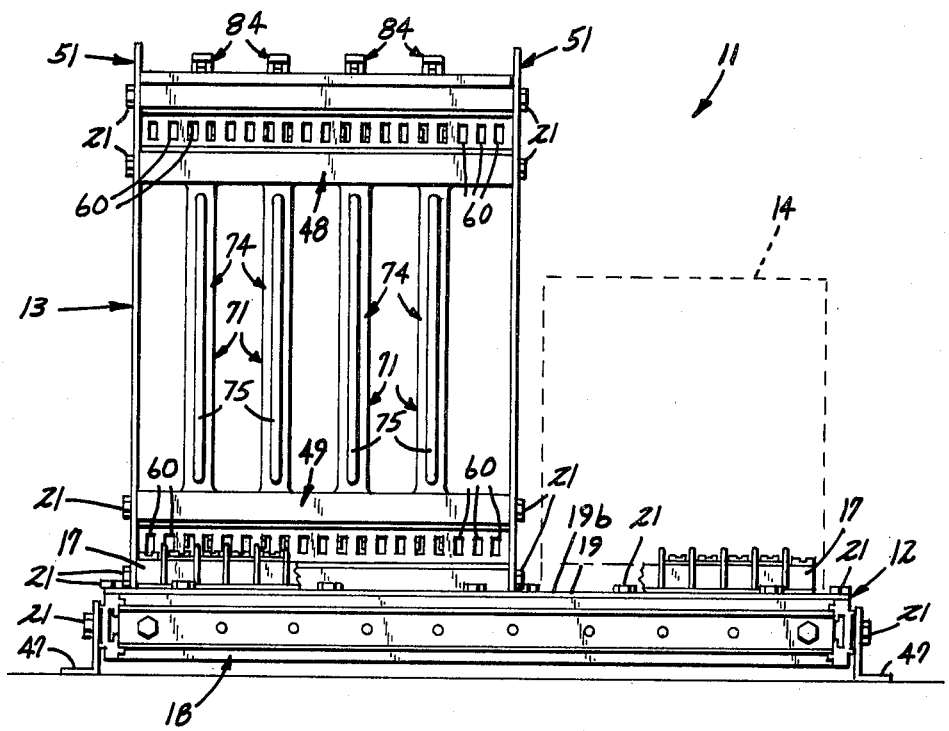
FIG. 1 is a view in side elevation of a modular mounting frame system for circuit boards embodying the inventive concepts.
Figure 2:
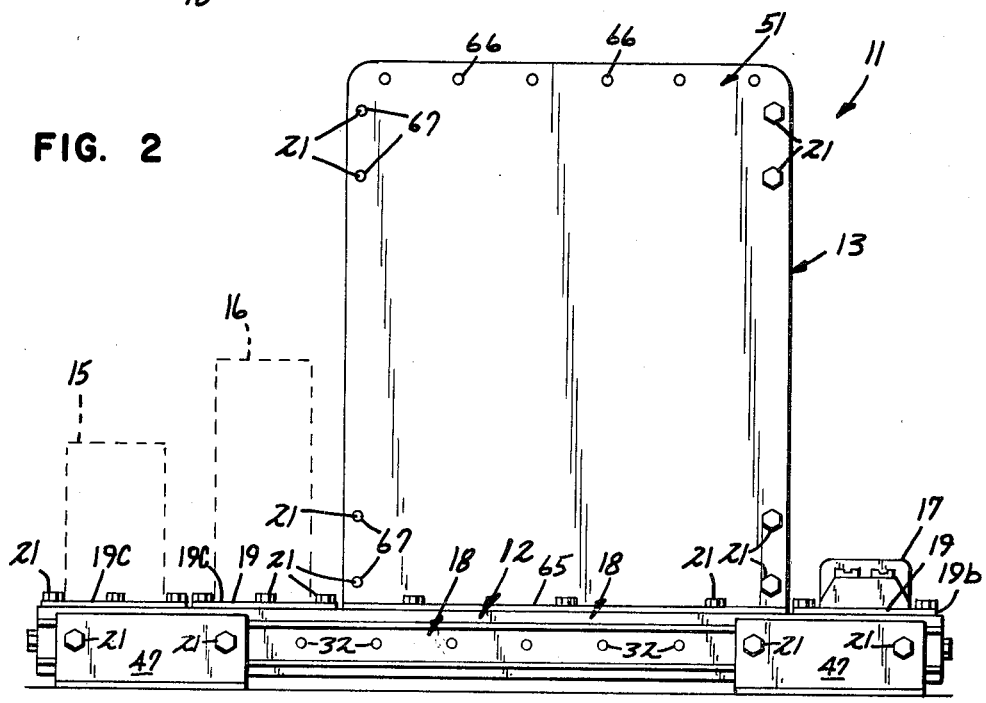
FIG. 2 is an end elevational view of the inventive modular mounting frame system.

With initial reference to FIGS. 1 and 2, a modular mounting frame system embodying the inventive concepts is represented generally by the numeral 11. Modular system 11 broadly comprises a base frame assembly 12 and a card cage 13. With additional reference to FIGS. 3 and 4, the base frame assembly 12 in the embodiment shown is rectangular in shape and considerably larger than the card guide 13 from the standpoint of horizontal surface area. As such, the base frame assembly 12 is adapted to receive and support not only the card guide 13 but other electrical components as well, which bear the reference numerals 14–16 in FIGS. 1 and 2. As an example, the electrical components 14–16 may include a fan, power supply, heat sink or connector plate. Another example is a terminal strip, which is represented by the numeral 17 in FIGS. 1–3 and extends along the entire length of one of the sides of the base frame assembly 12.

With reference to FIGS. 3–9 and 14–15, the base frame assembly broadly comprises a plurality of mounting rails 18 of various lengths and a plurality of mounting plates 19 of various rectangular size, the rails 18 and plates 19 being interconnected by screw-type fasteners 21, internal universal fasteners 22 (FIGS. 6–9) and internal corner fasteners 23 (FIGS. 14–15).

With specific reference to FIG. 5a, each of the mounting rails 18 comprises an extrusion, preferably of aluminum, having a length that is substantially a multiple of the dimension L. In the preferred embodiment, the dimension L is two inches, and the rails 18 are available in lengths substantially two inches to twenty-four inches in two inch intervals. The width of the mounting rails 18 is constant, and in the preferred embodiment the dimension is ⅞ of an inch.

Figure 4:
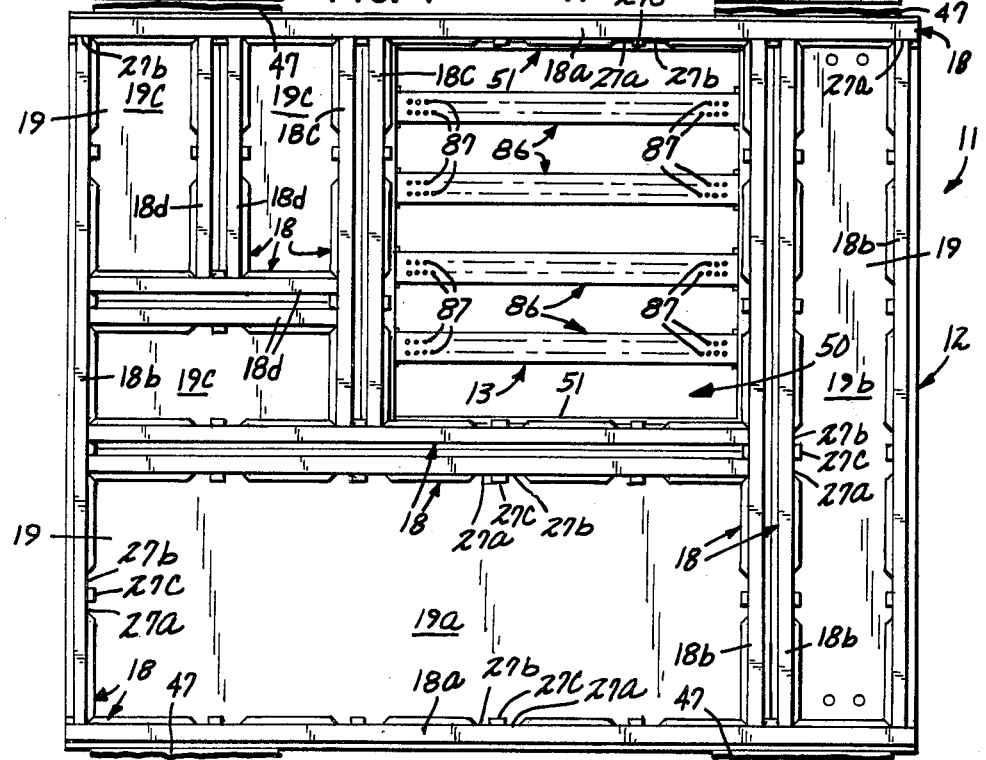
FIG. 4 is a view in bottom plan of the inventive modular mounting frame system.

With specific reference to FIG. 4, mounting rails of various length are used both longitudinally and transversely as the basic framework for base frame 12. As will become apparent below, a butt joint is used to interconnect the various mounting rails 18. The transverse rails are always disposed between two longitudinal rails. As such, the desired transverse dimension is always the length of a transverse rail plus twice the thickness of the longitudinal rails. Thus, for example, if a base frame is to have an external dimension of 10 inches by 12 inches (the external dimension of the preferred embodiment), the longitudinal rails will be 12 inches long, and the transverse rails will be 11½ inches long. This difference is best seen in FIG. 4, where the primary longitudinal rail 18a is formed with a pair of end notches or recesses to receive the ends of the primary transverse rails 18b in butt joint relation. Each of these notches is ¼ inch in width in the preferred embodiment to receive the thickness of the transverse rails 18b. The transverse rails 18b do not include such notches, and their length is accordingly ½ inch less than that of the longitudinal rail 18a.

The other mounting rails of the base frame assembly 12 bear the reference numerals 18c, 18d, with the shorter lengths including the highest reference letter.

Reference is made to FIGS. 5a, 6, and 7 for a specific structural configuration of the mounting rails 18, which permits selective, rigid interconnection quickly and easily. Each of the rails 18 comprises a primary longitudinal web 24 having upper and lower offset projecting crowns 25. Each of the crowns 25 defines an edge for the rail 18 and is adapted to receive clip-on insulators or identification tabs as discussed below.

On the backside of mounting rail 18 are a pair of longitudinal, symmetrically spaced ridges 26 that project laterally from the upper and lower edges of the web 24. Projecting oppositely from the inner side of the mounting rail 18 are a pair of symmetrically spaced longitudinal ridges 27. These ridges 27 are offset relative to the ridges 26 by substantially the thickness of a ridge. As such, the ridges 26 of one mounting rail 18 will fit between the ridges 27 of another rail 18. As best shown in FIG. 5a, notch pairs 27a, 27b are formed at repeating intervals along the longitudinal ridges 27. The notches 27a, 27b are spaced by a residual tab 27c, the center to center distance of which defines the measurement L mentioned above. The inner edge of each of the notches 27a, 27b (i.e., the edge defined by the residual tab 27c) is perpendicular to the flat rail side. The outer edges of the notches 27a, 27b are beveled, preferably at 45°. The end of each of the ridges 27 is also beveled at the same angle as shown at 27d.

In the preferred embodiment the base of the notch is ¼ of an inch, and the thickness of the mounting rail 18 is ⅛ of an inch, exclusive of the ridge 26.

As configured, and as best shown in FIG. 7, the end of one mounting rail may be received in perpendicular, butt joint relation within the vertically aligned notches 27a or 27b of another mounting rail. When interconnected in this manner, the residual tab 27c overlies the outer rail 26 in locking relation, whereas the inner rails 27 engage the beveled corners in complementing relation. This is best shown in FIG. 4, where the end of one of the transverse mounting rails 18b is received in the end notch 27b of the longitudinal rail 18a, and the end of the opposite transverse rail 18b is received in the end notches 27a of longitudinal rail 18a.

Each of the mounting rails 18 further includes a pair of longitudinal ridges 28 that project toward each other in parallel, spaced relation to the inner face of web 24 to define a captured T-shaped slot 29. The slot 29 is configured to receive and retain either of the internal fasteners 22, 23, as discussed below.

Each of the mounting rails 18 further includes a plurality of tapped bores 31 extending from the top crown 25 into the slot 29. The bores 31 are equidistantly spaced between the residual tabs 27c at uniform intervals, and in the preferred embodiment are two inches apart.

Extending laterally through the web 24 are a plurality of tapped bores 32. These tapped bores 32 are equidistantly spaced at a uniform interval, with the first bore 32 at each end being spaced from the end a distance equal to one-half the interval. In the preferred embodiment, the first bore 32 at each end is spaced ½ inch from the end, and the bores 32 are spaced apart by 1 inch intervals.

With reference to FIGS. 6–9, each of the universal fasteners 22 comprises a L-shaped stamping comprising a short leg 33 and a long leg 34 with a reinforcement indentation 35 formed therebetween. The short leg 33 has arcuate upper and lower edges 36 based on a diameter that is slightly less than the maximum vertical dimension of the T-shaped slot 29. The end edge 40 of the short leg 33 truncates the arcuate edges 36, and the transverse dimension between the edge 40 and the corner of the fastener 22 is less than the frontal opening of the slot 29. Further, the long leg 34 has a necked down portion 37 adjacent the short leg 33 so that, when the short leg 33 is inserted frontally into the slot 29, the entire fastener 22 may be rotated to a position of retention, as shown in FIG. 7. This simplifies the assembly of the rails 18 in perpendicular relation.

The long leg 34 generally has the same width or vertical dimension as the short leg 33. However, its extreme edge terminates in a pair of bifurcations 38 that diverge slightly so that the outer dimension thereof is slightly greater than the internal dimension of the T-shaped slot 29. The bifurcations 38 may be squeezed together through the formation of a pair of radiused surfaces 39 at their inner corners. As such, when the bifurcations 38 are inserted into the T-shaped slot 29, they are frictionally retained in a desired position.

Each of the universal fasteners 22 further comprises a pair of opposed, V-shaped recesses 41 that are spaced from the outer corner of the fastener 22 by an amount which corresponds generally to the distance between the end of a mounting rail 18 and the first tapped bore 31. As shown in FIG. 8, this spacing is such that, with two of the mounting rails 18 interlocked in butting relation, a screw fastener 21 screwed into the first tapped bore 31 will project into the slot 29 and into camming engagement with the angular surface of the V-shaped recess 41. This serves to tighten the rails 18 against each other, and to lock the assembly in place.

Each of the universal fasteners 22 further comprises a generally cylindrical projection 42 that extends from the inner face of the long leg 34 in the direction of the short leg 33. As shown in FIG. 8, the cylindrical projection 42 is spaced so that it generally overlies the first tapped bore 31 of the adjacent mounting rail 18 with the components in assembled relation. As such, the projection 42 accepts any screw fastener 21 extending through the first tapped bore 32, and which is long enough to project beyond the bore 32. In addition, in the preferred embodiment, the cylindrical projection 42 has an inner surface that is tapered relative to its axis, so that such a projecting screw 21 will engage such surface in camming relation, thus drawing the components tightly together as the screw 21 is tightened.

Fastener 22 is universal in the sense that it will interconnect two mounting rails 18 in a corner assembly (FIG. 6), or with one mounting rail 18 abutting another rail 18 at an intermediate point (FIG. 7). Further, fastener 22 serves several functions; viz., to quickly interconnect two or more mounting rails 18 together, to hold the components in loose, assembled relation, and to interconnect the components tightly in the final base frame assembly.

With reference to FIG. 14, the fastener 23 serves the principal function of a corner connector, including identical legs 43 that are necked down at the corner as shown at 44. A tapped bore 46 is formed through each of the legs 43, and spaced for alignment with the end bore 32 of mounting rail 18 with the members in assembled relation (FIG. 15). With screw fasteners 21 inserted as shown in FIG. 15, the abutting mounting rails 18 are held rigidly together.

The base frame assembly 12 further comprises a plurality of mounting plates 19 which are made available in various sizes to accommodate the modular concept. Preferably, the mounting plates 19 are dimensioned substantially in multiples of the dimension L discussed above, although the base dimension is slightly less for manufacturing tolerances and proper fit. With L equal to two inches, the preferred embodiment includes a mounting plate 19a which is approximately four inches by ten inches, a mounting plate 19b which is approximately two inches by ten inches, and three mounting plates 19c each of which is approximately two inches by four inches. Each of the mounting plates is formed with bores or apertures 20 that are spaced corresponding to the tapped bores 31 in the mounting rails 18. Thus, in the preferred embodiment, the apertures 20 extend along each edge of the plate slightly less than one inch from each end at two inch intervals.

Last, the base frame assembly 12 preferably includes four feet 47 (FIGS. 1–3), each of which is L-shaped and has a length chosen to encompass two of the threaded apertures 32 for rigid mounting by screw fasteners 21. The vertical dimension of the feet 47 preferably elevates the base frame assembly 12 from the supporting surface, as shown in FIGS. 1 and 2.

Figure 3:
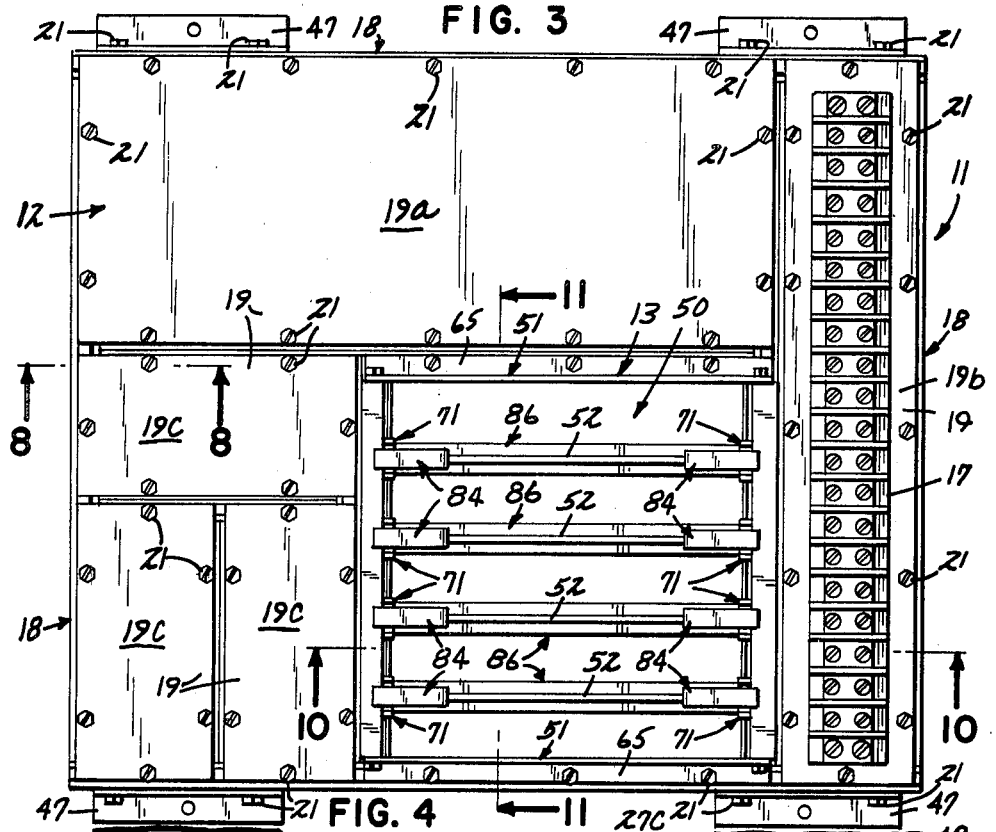
FIG. 3 is a view in top plan of the inventive modular mounting frame system.

As best shown in FIGS. 3 and 4, the base frame assembly 12 of the preferred embodiment uses a double mounting rail construction within the external frame for greater strength and rigidity. This is facilitated by the double notch construction described above. In addition, the double rail construction provides better end support for the card cage 13 around the periphery of a rectangular card cage opening 50 which the mounting plates 19 do not cover.

Card cage 13 and its components are shown in FIGS. 1-4, 5b-5d and 10-13. With specific reference to FIGS. 1-2, 5b-5d and 10, card cage 13 comprises a frame defining a rectangular parallelepiped made up of a pair of upper mounting rails 48, a pair of lower mounting rails 49 and a pair of side plates 51. The upper and lower mounting rails 48, 49 are of identical length, with the upper rails 48 disposed in opposed, spaced relation over the parallel, spaced rails 49. The side plates 51 are secured by screw fasteners 21 extending into the respective ends of the mounting rails 48, 49, as described in further detail below. As constructed, the components 48, 49 and 51 together define a frame cage adapted to receive a plurality of printed circuit boards or cards 52, the construction and interrelationship of which are also discussed in detail below.

With reference to FIG. 5b, mounting rail 48 comprises a web 53 symmetrically disposed between upper and lower beams 54, 55, respectively. The web 53 is formed with a plurality of rectangular apertures 60 which are spaced at uniform intervals over the web length.

The upper beam 54 terminates in a crown 56 extending longitudinally along its entire upper edge, and which is similar in configuration to the crowns 25 of mounting rail 18. On the inner face of upper beam 54, a horizontally disposed longitudinal slot 57 is formed, which takes the form of a small circular bore that opens onto the inner face of the beam 54 through a V-shaped recess. The slot 57 is disposed and configured to receive one of the screw fasteners 21, which may be of the self-tapping type.

The lower beam 55 has a longitudinal slot 58 similar to the slot 57 formed in its inner face. The bottom edge of lower beam 55 also has a rectangular channel or groove 59 extending over its entire length.

Opposed, beveled ridges 61, 62 project from the respective beams 54, 55 to define a captured, T-shaped slot 63 that is similar in size and configuration to the slot 29 of mounting rail 18.

Mounting rail 49 is very similar to the mounting rail 48, and like reference numerals are used where the structure is identical. Mounting rail 49 is different in that a channel or groove of rectangular cross section is formed in its upper longitudinal edge in place of the crown 56 of mounting rail 48. Further, on the inner face of the lower beam 55, and along its lower edge, an angled ledge 64 is formed which serves as a carrier for other components, as discussed below.

In the preferred embodiment, the mounting rails 18, 48 and 49 are all extruded from aluminum and are thereafter machined to form the various notches, apertures, bores and the like.

The side plates 51 are generally rectangular with each of the upper corners radiused. The bottom edge is bent outward to form a foot 65, and apertures disposed in a row are formed through the foot 65 in spaced relation corresponding to the distance between the tapped bores 31 in mounting rail 18. This permits the card cage 13 to be secured to the base frame assembly 12 by screw fasteners 21, as shown in FIGS. 13.

As best shown in FIG. 2, mounting apertures 66 are formed in a row along the upper edge of side plate 51, and two pairs of mounting apertures 67 are formed along each of its side edges in spaced relation to the longitudinal slots 57, 58 of mounting rails 48, 49. The vertical distance between the aperture pairs 67 is chosen to conform to the length of each of a plurality of printed circuit card guides 71, which are discussed below.

As constructed, the frame portion of card cage 13 (consisting of the mounting rails 48, 49 and side plates 51) is constructed and sized to fit within the rectangular opening 50 on the top surface of base frame assembly 12 which is not covered by mounting plates 19a-19c (FIG. 3). In the modular embodiment shown, this rectangular opening 50 is six inches by six inches, and as shown in FIG. 4, it is bounded in part by one of the external longitudinal mounting rails 18a, and internally of the frame assembly 12 by two mounting rails 18b and one mounting rail 18c. These mounting rails together support the feet 65 of the side plates 51 and the lower edges of the lower mounting rails 49. As shown in FIG. 2, in the assembled form the feet 65 are flush with the mounting plates 19a-19c.

The printed circuit card guides 72 are shown in FIGS. 1, 3-4 and 10-13. With specific reference to FIG. 12, each guide 71 is elongated in shape, defining head portions 72, 73 at opposite ends interconnected by a necked down connector 74. An external strengthening rib 75 extends longitudinally along the outer surface of the connector 74.

Head 72 terminates in a pair of longitudinally extending tabs 76 that are symmetrically spaced apart for a purpose described below. Head 73 has a pair of identical tabs 77.

Projecting laterally outward from the outer face of head 72 are a pair of snap-in connector tabs 78, 79. With additional reference to FIG. 13, the connector tabs 78, 79 are spaced apart a distance corresponding to the distance between the rectangular apertures 60 of mounting rails 48, 49, and small barbs 78a, 79a are formed on their outer surfaces in a position to lock the guide 71 into place when the connecting tabs 78, 79 are fully inserted. The tabs 78, 79 are capable of a limited degree of resilient deflection toward each other to permit entry into and through the rectangular apertures 60. The bottom edge of each of the connectors 78, 79 is beveled, as shown in 78b, 79b for guided entry into the apertures 60.

The head portion 73 is formed with a pair of similar snap-in connector tabs 81, 82, which likewise project outwardly from its outer surface.

A longitudinal groove 83 is formed in the inner surface of guide 71, extending symmetrically over its entire length. As best shown in FIG. 13, the side surfaces of the groove 83 diverge slightly to insure that a printed circuit card 52 is properly received.

With continued reference to FIG. 13, the connector tab pair 78-79 is laterally offset relative to a longitudinal axis of the guide 71, the tab 79 being closer to its side of the guide 71 than the tab 78 is to its associated side. The connector tab pair 81-82 is positioned in the same manner. Accordingly, with the guide 71 snapped into place into the mounting rails 48, 49, the groove 83 is slightly offset or staggered from the position it would otherwise assume if the connector tabs were symmetrically oriented.

This offset feature of the connector tabs 78–79, 81–82 permits adjustment to the position of the printed circuit cards 52 in increments smaller than the spacing between rectangular aperture 60. This is accomplished simply by turning the guide end for end, so that the head portion 73 is at the top of the card cage 13, with the connector tabs 81–82 inserted into the mounting rail 48 (see FIG. 13). This feature eliminates the problem caused by very small holes on the mounting rails with fragile snap connectors, or too little supporting material in the rail. In the embodiment shown, the rectangular apertures 60 are spaced apart at 0.20 inch centers, and the tabs 78–79, 81–82 are offset to provide adjustments in 0.10 inch increments with a minimum of 0.50 inch spacing between the printed circuit cards 52.

Preferably, the guides are molded from plastic to be electrically insulative.

With reference to FIGS. 10 and 11, the printed circuit card guides 71 are used in opposed pairs for each printed circuit card 52. Card 52 is generally rectangular in shape, and includes a pivoted handle 84 at each of its upper corners. These handles 84 are of conventional construction and include a tail 84a that fulcrums against the top edge of mounting rail 48 to assist in removal of the card 52 from its electrical connection.

A plurality of discrete, embedded electrical contacts 85 are disposed along the lower edge of the printed circuit card 52 in a conventional manner. The lower card edge is sized and configured to be received in a socket-type connector 86. As shown in FIGS. 10 and 11, each of the connectors 86 is elongated, extending the entire internal width of the card cage 13. The connector 86 defines a longitudinal groove or socket along its upper edge into which the lower edge of the printed circuit card 52 is inserted, and it has a plurality of separate, internal contacts that are disposed in alignment with the embedded contacts 85 of the card 52. These internal contacts are respectively connected to two longitudinal rows of conductor pins 87 that project downwardly from the connector 86. The pins 87 serve as electrical connections to external leads (not shown).

With continued reference to FIG. 10, each of the socket connectors 86 has a hook 88 integrally formed at each end that conforms to the angled ledge 64 of the mounting rails 49. Accordingly, the socket connectors 86 are easily inserted into place before the guides 71 and cards 52 are added. The connector 86 is locked into the desired position by placement of an associated pair of card guides 71. With reference to FIGS. 10 and 11, each connector 86 is locked vertically by the angled ledge 64 and hook 88 which limit downward movement, and the lower end of the guide 71 and upper edge of the connector 86 limit upward movement. Lateral movement of the connectors 86 is precluded by the tabs 76 or 77, which are spaced to receive the connector 86 therebetween.

With an associated pair of card guides 71 inserted and locked into place, the printed circuit card 52 may be slidably inserted into the grooves 83 of guides 71. The guides 71 guide the printed circuit card 52 downward until the lower card edge is received in electrical contact with the connector 86.

With continued reference to FIGS. 10 and 11, an elongated cap 89 of electrically insulating material (preferably extruded plastic) is snapped over the crown 56 of the upper mounting rails 48 (see also the enlarged detail of the second embodiment in FIG. 19). These caps 89 may be used to identify the printed circuit cards 52 inserted into the card cage 13, or to provide an electrical insulating function as described below.

A modification to the modular system 11 is shown in FIGS. 16–20, in which like numerals for components common to both of the systems are used. The modified system, which bears the general reference numeral 91, utilizes a mother board 92 which serves as a common electrical connection to the several printed circuit cards 52. As shown in FIGS. 16 and 17, the mother board 92 is rectangular in shape, and has a length and width corresponding to the length and width of the card cage 13. As such, it fits into the rectangular opening within the base frame assembly 12 beneath the card cage 13.

The mother board 92 does not, however, rest directly on the mounting rails 18a–c in the embodiment shown. Rather, caps 89 are snapped onto the crowns 25 of the mounting rails 18a–c that bound the rectangular card cage opening to electrically insulate the mother board 92 from the mounting rails 18a–c, which in the preferred embodiment are electrically conductive. Further, and as shown in FIG. 17, plastic washers 93 are disposed between the upper surface of the mother board 92 and the mounting feet 65 of the side plates 51, which are electrically conductive. The use of the caps 89 and washers 93 is optional, depending on the presence of electrically conductive components along the peripheral edges of the mother board 92, or the use of transverse mounting rails 18 within the rectangular card cage opening over which the mother board 92 is positioned.

As shown in FIG. 20, the lower mounting rails 48 are spaced from the mother board 92, avoiding any problem of electrical contact.

With continued reference to FIGS. 16–18, a modified socket connector 94 is used to receive the printed circuit cards 52, and to interface directly with the mother board 92. Because the position of the connector 94 on the mother board 92 is critical, it must be secured semipermanently. In the embodiment shown, this is accomplished by providing a countersunk vertical bore through each end of the connector 94 and securing it to the mother board 92 through the use of screw-nut assemblies 96. In addition, the connector 94 is soldered to the mother board 92.

Because of the need of semipermanent connection of the connectors 94 to the mother board 92, it is not necessary for the card cage 13 to offer support to the connectors 94 as in the first embodiment. Consequently, and as best shown in FIG. 16, mounting rails 48 are used in both lower and upper positions of the card cage 13 (so that there is no inwardly projecting angled ledge 64), and the ends of each connector 94 define vertical faces that are spaced from the inner faces of the lower mounting rails 48.

The connector 94 has two rows of electrical contacts 97 that are spaced in conformance to the embedded contacts 85 on the bottom edge of the cards 52. Connecting pins 98 that are somewhat shorter than the connecting pins 87 of connector 86 project downward from the contacts 97. The pins 97 are disposed and configured to project through conductive apertures within the mother board 92. The length of the pins 87, 97 may be long or short depending on the requirements of the particular system.

Because of the mother board concept, the embodiment of FIGS. 16–20 is assembled in a slightly different manner than the embodiment of FIGS. 1–15. Before the card cage 13 is secured to the base frame assembly 12, the socket connectors 94 are secured in place to the mother board 92, thus constituting a separate subassembly. Insulating caps 89 are placed over the crowns of the mounting rails 18a-c as is necessary, and the mother board 92-connector 94 subassembly is thereafter placed over the rectangular card cage opening. At this point, the card cage 13 is screwed into place in overlying relation to the mother board 92, using plastic washers 93 as necessary.

This is followed by the placement of pairs of guides 71 in alignment with associated connector 94, and insertion of the printed circuit cards 52 in substantially the same manner as the first embodiment.

FIGS. 21-23 disclose a modified side plate 101 constructed for use with the mounting rails 48, 49. Side plate 101 is quite similar to the side plate 51, with the exception that each of its side edges has a pair of spaced connector tabs 102 formed therein which are configured for insertion into the mounting rail slot 29. As shown in FIG. 23, each of the connector tabs 102 comprises a bifurcated tongue bent perpendicularly to the face of plate 101. The outer edges of the tab 102 define barbs 103 constructed to engage and be retained by the sides of the slot 29.

A card cage may be quickly assembled by inserting the respective tabs 102 into the slot 29 of upper and lower mounting rails 48, 49, respectively. Because of the barbs 103, the bifurcated tabs 102 will be frictionally retained within the slot 29. Preferably, the mounting plate 101 includes mounting apertures 104 on each side of each tab 102 and disposed in alignment with the mounting rail slots 57, 58. Screw fasteners 21 will then serve to draw up the card cage assembly rigidly and tightly.

FIG. 21 also discloses the use of an elongated screen 105 that is disposed within the opposed channels 59 of the mounting rails 48, 49. Screen 105 provides ventilation to the circuitry within the card cage 13, and also prevents the accidental entry of any metallic fragment or article that could cause a short in the internal circuitry. Alternatively, a solid plate could be used in place of the screen 105.

In FIGS. 24 and 25, a further embodiment of an end plate 111 having a modified connecting tab 112 is shown. Connector tab 112 is disposed on the side edge of the side plate 111 in the same position as connector tabs 102, but comprises a single tongue member the width of which conforms to the width of the mounting rail slots 29. Centrally punched in its face is a single barb 113 that engages the opposed face of the slot 29 in frictional retention.

FIGS. 26 and 27 disclose an alternative embodiment of a mounting rail 114. Mounting rail 114 comprises a thick web 115 from which opposed offset crowns 116 extend in opposite directions.

A pair of ridges 117 corresponding to the ridges 27 project laterally from the inner face of the mounting rail 114. Opposed ridges 118 corresponding to the ridges 117 define a captured, T-shaped slot 119. However, the back side of the mounting rail does not include any laterally extending ridges, and the web has a width that corresponds to the outside dimension of the ridges 117.

With specific reference to FIG. 26, a pair of notches 121a, 121b are formed through the ridges 117 at repeating intervals in a manner similar to the notches 27a, 27b. However, the notches 121a, 121b have a dovetailed configuration, and a residual tab 121c has side edges that converge in the direction of the associated crown 116.

The end of each of the mounting rails 114 is formed with a male dovetail 122 to fit into the dovetailed notches 121a, 121b. The dovetailed components 121a, 121b, 122 hold the mounting rail 114 in a desired assembly until mounting plates or circuit boards are added to strengthen and solidify the base frame assembly. The tapped bores and mounting apertures of the mounting rails 114 are therefore otherwise the same as for the mounting rails 18.

As constructed and described, each of the embodiments disclosed comprises a modular assembly that offers substantial flexibility in size and configuration without the need of varying or modifying the available components. The end result is a modular system that is simply and easily fabricated from available components while at the same time uniquely suited to the particular electronic application.

What is claimed is:

1. A universal rail member usable in selected lengths in a modular frame assembly, comprising:
    (a) an elongated web;
    (b) a pair of first ridge members projecting laterally outward from one side of the web, the first ridge members extending over the length of the web in spaced, parallel relation;
    (c) a pair of second ridge members projecting laterally outward from the opposite side of the web, the second ridge members extending over the length of the web in parallel relation and spaced apart so that the first ridges of one rail member are capable of engaging and interlockably fitting between the second ridge members of another rail member;
    (d) and at least one notch formed in each of the second ridge members, the notches being transversely aligned, and sized and configured to receive the end of another rail member in perpendicular, interlocking relation.

2. The rail member defined by claim 1, wherein a plurality of said notches are formed in the second ridge members at uniformly spaced intervals over the length of the rail member, the notches in one of said ridge members being respectively and transversely aligned with the notches of the other rail member.

3. The rail member defined by claim 1 or 2 which further comprises means defining a captured slot between the second members and extending over the length of the rail member.

4. The rail member defined by claim 3, wherein the captured slot is of a T-shaped configuration.

5. The rail member defined by claim 2, wherein the notches along each of said second ridges are formed in pairs, the notched pairs being spaced to receive the ends of two of said rail members mounted back to back.

6. The rail member defined by claim 1 or 2, which comprises longitudinal side edges each taking the form of a crown.

7. The rail member defined by claim 2, wherein:
    (a) one internal side of each of said notches is angled relative to the base of the notch, the opposite side being perpendicular to the notch base;
    (b) and the ends of each rail member are constructed to conform to the notch.

8. A modular frame assembly for electrical components comprising:
    (a) a plurality of elongated rail members of selected length disposed in longitudinal and transverse relation to define a rectangular frame, each mounting rail comprising (i) an elongated web;
(ii) a pair of first ridge members projecting laterally outward from one side of the web, the first ridge members extending over the length of the web in spaced, parallel relation;
(iii) a pair of second ridge members projecting laterally outward from the opposite side of the web, the second ridge members extending over the length of the web in parallel relation and spaced apart so that the first ridge members of one rail member are capable of engaging and interlockably fitting between the second ridge members of another rail member;
(iv) and a plurality of notches formed in the second ridge members at uniformly spaced intervals over the length of the rail member, the notches in one of said second ridge members being respectively and transversely aligned with the notches of the other, and the notches being sized and configured to receive the end of another rail member in perpendicular, interlocking relation;
(b) and means for securing each rail member to at least one other rail.

9. The frame assembly defined by claim 8, wherein the assembled rail members together define a supporting surface, and further comprising at least one mounting plate secured to the supporting surface.

10. The frame assembly defined by claim 8, wherein:
(a) each rail member further comprises means defining a captured, T-shaped slot between the second ridges and extending over the length of said member;
(b) and the securing means comprises an L-shaped fastener with first and second perpendicular legs configured and sized to slidably fit into the T-shaped slot.

11. The frame assembly defined by claim 10, wherein the first leg of the fastener is longer than the second leg and comprises friction means for frictionally engaging the slot sides to retain the fastener in the slot.

12. The frame assembly defined by claim 11, wherein the friction means comprises a diverging bifurcation at the end of the first leg, the diverging bifurcation being sized and yieldably constructed for frictional insertion and retention within the slot.

13. The frame assembly defined by claim 11, wherein the second leg of the fastener has a first transverse dimension permitting entry into the slot through the front face thereof, and a second transverse dimension sufficient to retain the second leg in the slot.

14. The frame assembly defined by claim 13, wherein the second leg is formed with opposed arcuate edges associated with the second dimension, whereby the second leg may be inserted into the slot through the face thereof and thereafter rotated to a position of retention.

15. The frame assembly defined by claim 1, wherein:
(a) each rail member further comprises a plurality of uniformly spaced, tapped bores extending from each edge thereof into said slot;
(b) and the first leg of the fastener further comprises V-shaped notches formed in the edges thereof and disposed to receive a screw through one of said tapped bores in camming relation.

16. The frame assembly defined by claim 11, wherein:
(a) each rail member further comprises a plurality of uniformly spaced, tapped bores formed through said web;
(b) and the first leg of the fastener further comprises a substantially cylindrical projection having a tapered inner surface, the projection being disposed to receive a screw through one of said tapped bores in camming relation.

17. A universal rail member usable in selected lengths in a modular frame assembly, comprising:
(a) an elongated web of predetermined thickness and width and defining first and second longitudinal faces and first and second longitudinal edges;
(b) first ridge means projecting laterally outward from said first face, the first ridge means being of predetermined configuration and extending substantially over the length of the web;
(c) second and third ridge means projecting laterally outward from said second face and extending substantially over the length of the web in parallel, spaced relation, the second and third ridge means being spaced apart to define a longitudinal recess therebetween and configured to interlockably receive the first ridge means of another rail member;
(d) and at least one notch formed in each of said second and third ridge means, the notches being transversely aligned, and sized and configured to receive the end of another rail member in perpendicular, interlocking relation.

18. The rail member defined by claim 17 which further comprises means defining a captured slot between the second and third ridge means and extending over the length of the rail member.

19. The rail member defined by claim 18, wherein the captured slot is of a T-shaped configuration.

20. The rail member defined by claim 17, wherein a plurality of said notches are formed in the second and third ridge means at uniformly spaced intervals over the length of the rail member, the notches in one of said second and third ridge means being respectively and transversely aligned with the notches of the other.

* * * * *